United States Patent
Takama

(10) Patent No.: US 10,842,060 B2
(45) Date of Patent: Nov. 17, 2020

(54) COMPONENT MOUNTING DEVICE

(71) Applicant: YAMAHA HATSUDOKI KABUSHIKI KAISHA, Iwata (JP)

(72) Inventor: Kazushi Takama, Iwata (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 319 days.

(21) Appl. No.: 15/757,479

(22) PCT Filed: Oct. 14, 2015

(86) PCT No.: PCT/JP2015/079075
§ 371 (c)(1),
(2) Date: Mar. 5, 2018

(87) PCT Pub. No.: WO2017/064776
PCT Pub. Date: Apr. 20, 2017

(65) Prior Publication Data
US 2018/0249610 A1 Aug. 30, 2018

(51) Int. Cl.
H05K 13/08 (2006.01)
H05K 13/04 (2006.01)

(52) U.S. Cl.
CPC ..... H05K 13/0815 (2018.08); H05K 13/0408 (2013.01)

(58) Field of Classification Search
CPC . H05K 13/0408; H05K 13/08; H05K 13/0815
See application file for complete search history.

(56) References Cited

U.S. PATENT DOCUMENTS 6,317,972 B1  11/2001  Asai et al.

FOREIGN PATENT DOCUMENTS

| CN | 101107899 A | | 1/2008 |
|---|---|---|---|
| CN | 104105391 A | | 10/2014 |
| JP | 2003-298294 A | | 10/2003 |
| JP | 2005-537630 A | | 12/2005 |
| JP | 2007-511094 A | | 4/2007 |
| JP | 2007-214460 A | | 8/2007 |
| JP | 2008-098411 A | | 4/2008 |
| JP | 2008-103426 A | | 5/2008 |
| JP | 2008-516453 A | | 5/2008 |
| JP | 2009-027015 A | | 2/2009 |
| JP | 2009027015 A | * | 2/2009 |

(Continued)

OTHER PUBLICATIONS

An Office Action mailed by the Japanese Patent Office dated Oct. 30, 2018, which corresponds to Japanese Patent Application No. 2017-545040 and is related to U.S. Appl. No. 15/757,479.

(Continued)

Primary Examiner — Livius R. Cazan
(74) Attorney, Agent, or Firm — Studebaker & Brackett PC

(57) ABSTRACT

A component mounting device includes a control unit that at least controls an imaging portion to image a vicinity of a mounting position during movement of a mounting head, acquires height information in the vicinity of the mounting position based on an imaging result of the imaging portion, and corrects a target lowering position of the mounting head based on the acquired height information in the vicinity of the mounting position.

10 Claims, 5 Drawing Sheets

(56) References Cited

FOREIGN PATENT DOCUMENTS

| JP | 2014-093390 A | 5/2014 |
| JP | 2014-216621 A | 11/2014 |
| WO | 2012/056617 A1 | 5/2012 |

OTHER PUBLICATIONS

An Office Action mailed by the State Intellectual Property Office of the People's Republic of China dated Aug. 1, 2019, which corresponds to Chinese Patent Application No. 201580083218.0 and is related to U.S. Appl. No. 15/757,479.
International Search Report issued in PCT/JP2015/079075; dated Jan. 19, 2016.
Written Opinion issued in PCT/JP2015/079075; dated Jan. 19, 2016.

\* cited by examiner

FIG.5
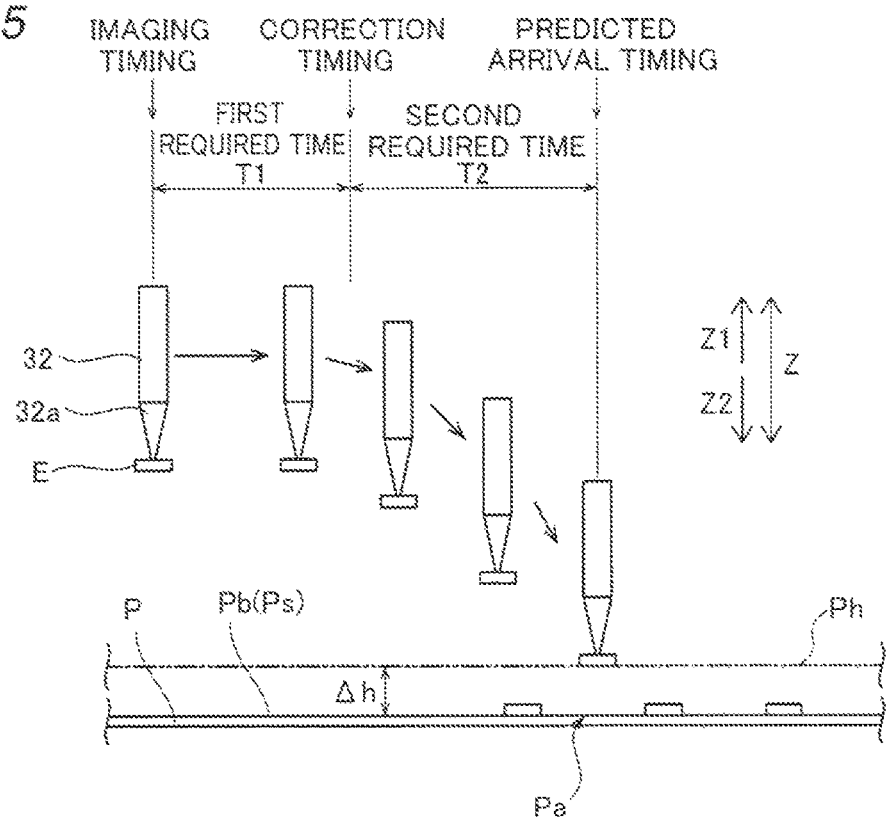
FIG.6 EXAMPLE OF DOWNWARD MOVEMENT OF MOUNTING HEAD
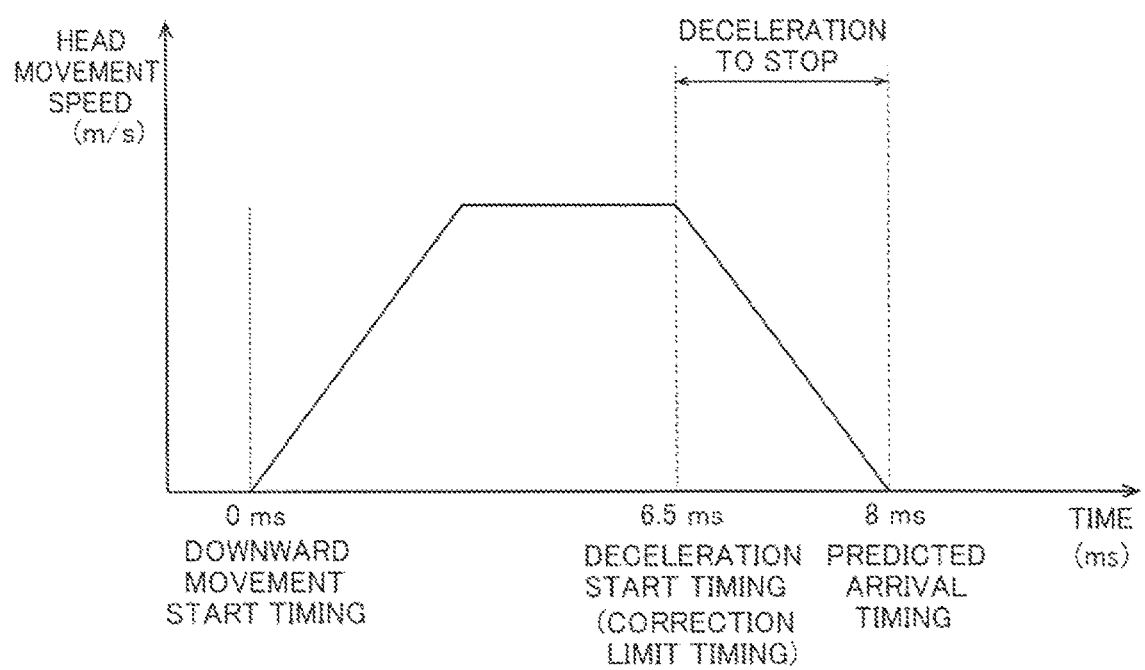

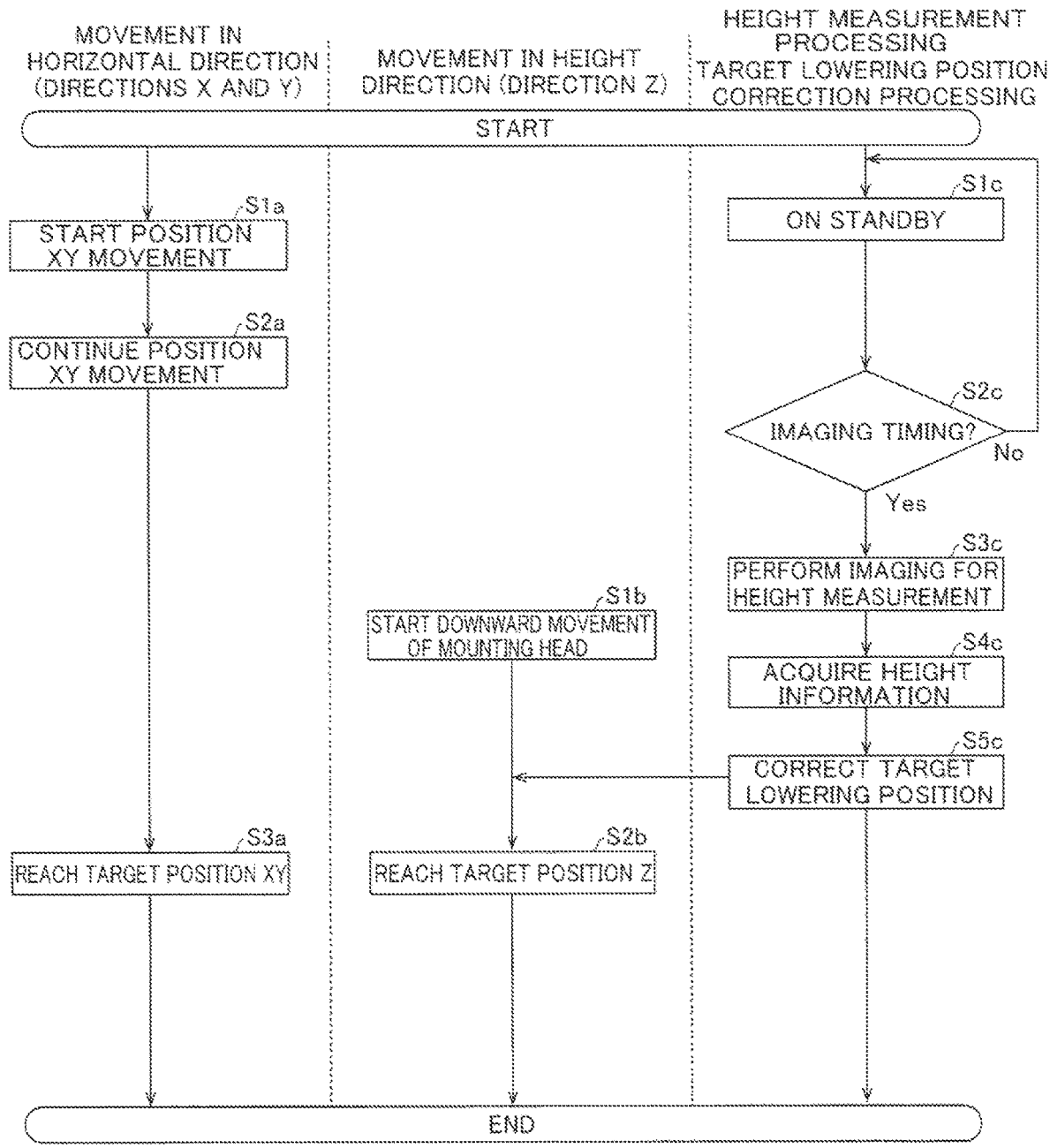

(SECOND EMBODIMENT)

MODIFICATION

COMPONENT MOUNTING DEVICE

CROSS-REFERENCE TO RELATED APPLICATION

This application is a National Stage of International Patent Application No. PCT/JP2015/079075, filed Oct. 14, 2015, the entire content of which is incorporated herein by reference.

BACKGROUND

Technical Field

The present disclosure relates to a component mounting device, and more particularly, it relates to a component mounting device that corrects a target lowering position of a mounting head.

Background Art

In general, a component mounting device that corrects a target lowering position of a mounting head is known as described, for example, in Japanese Patent Laying-Open No. 2014-216621.

The aforementioned Japanese Patent Laying-Open No. 2014-216621 discloses a component mounting device including a suction nozzle (mounting head) that suctions a component to be mounted on a substrate and a camera module that images a component mounting position on the substrate. In this component mounting device, the component mounting position is imaged by the camera module in a state where the suction nozzle stops directly above the component mounting position. In this component mounting device, conceivably, a target lowering position of the suction nozzle is corrected based on the measurement result of the camera module, and the position of the suction nozzle is corrected.

SUMMARY

However, in the component mounting device disclosed in the aforementioned Japanese Patent Laying-Open No. 2014-216621, the component mounting position is imaged by the camera module in a state where the suction nozzle stops directly above the component mounting position, and hence latency occurs in the operation of the suction nozzle (mounting head). Therefore, there is such a problem that the time required to produce the substrate is increased by occurring latency.

The present disclosure has been proposed in order to solve the aforementioned problem, and provides a component mounting device capable of significantly reducing or preventing an increase in the time required to produce a substrate even when correcting a target lowering position.

A component mounting device according to as aspect of the present disclosure includes a mounting head that moves with respect to a substrate and mounts a component at a mounting position on the substrate, and an imaging portion that moves together with the mounting head and images the substrate. The component mounting device further includes a control unit that determines an imaging timing of the imaging portion based on a predicted arrival timing at which the component is predicted to reach the substrate, at least controls the imaging portion to image a vicinity of the mounting position at the determined imaging timing during movement of the mounting head, acquires height information in the vicinity of the mounting position based on an imaging result of the imaging portion, and corrects a target lowering position of the mounting head based on the acquired height information in the vicinity of the mounting position.

The component mounting device according to this aspect of the present disclosure includes the control unit that at least controls the imaging portion to image the vicinity of the mounting position, as described above. Thus, it is not necessary to stop the mounting head for imaging to correct the target lowering position, and hence it is possible to prevent at least latency for the imaging operation from occurring in the operation of the mounting head. Consequently, even when the target lowering position is corrected, it is possible to significantly reduce or prevent an increase in the time required to produce the substrate. Furthermore, the control unit is configured to determine the imaging timing of the imaging portion based on the predicted arrival timing at which the component is predicted to reach the substrate such that the imaging portion can easily perform imaging during the movement of the mounting head unlike the case where the imaging timing of the imaging portion is determined on a positional basis.

In the aforementioned component mounting device according to this aspect, the control unit is preferably configured to control the imaging portion to image the vicinity of the mounting position, acquire the height information in the vicinity of the mounting position based on the imaging result of the imaging portion, and correct the target lowering position of the mounting head based on the height information in the vicinity of the mounting position, during the movement of the mounting head. According to this structure, the operation from the imaging operation to the correction processing can be performed during the movement of the mounting head, and hence it is possible to effectively significantly reduce or prevent occurrence of latency in the operation of the mounting head. Consequently, it is possible to effectively significantly reduce or prevent an increase in the time required to produce the substrate.

In this case, the control unit is preferably configured to determine the imaging timing in consideration of a first required time required from imaging of the vicinity of the mounting position to correction of the target lowering position and a second required time required from the correction of the target lowering position to arrival of the component at the substrate. When imaging for correcting the target lowering position is performed during the movement of the mounting head, no time for imaging is independently provided unlike the case where imaging is performed after the mounting head is stopped, and hence there is a high need to properly set the imaging timing of the imaging portion. Therefore, as described above, the control unit is configured to determine the imaging timing of the imaging portion in consideration of the first required time and the second required time such that it is possible to determine the imaging timing in consideration of both the first required time required from imaging of the vicinity of the mounting position to correction of the target lowering position and the second required time required from the correction of the target lowering position to arrival of the component at the substrate, and hence it is possible to properly set (determine) the imaging timing of the imaging portion.

In the aforementioned structure in which the imaging timing is determined in consideration of the first required time and the second required time, the control unit is preferably configured to determine, as the imaging timing, a timing traced back from the predicted arrival timing by at least a sum of the first required time and the second required time. According to this structure, a time point at which at least the first required time required from imaging of the vicinity of the mounting position to correction of the target lowering position and the second required time required from the correction of the target lowering position to arrival of the component at the substrate are ensured can be determined as the imaging timing. Consequently, the imaging portion can perform imaging in a state where the first required time and the second required time are ensured. Therefore, even when imaging for correcting the target lowering position is performed during the movement of the mounting head, correction of the target lowering position can be reliably made in time before the component is mounted on the substrate, and hence it is possible to reliably mount the component with the target lowering position corrected.

In this case, the control unit is preferably configured to predict that the component reaches the substrate at a height position higher than a reference height in a case where there is no positional deviation of the substrate in a height direction and determine the predicted arrival timing. According to this structure, even when the substrate is warped upward such that the mounting position is higher than the reference height, for example, correction of the target lowering position can be made in time before the component is mounted on the substrate.

In the aforementioned structure in which the imaging timing is determined in consideration of the first required time and the second required time, the control unit is preferably configured to acquire a fixed value as the second required time. According to this structure, it is not necessary to acquire the second required time for each component mounting operation, and hence it is possible to significantly reduce or prevent an increase in the processing load on the control unit.

In the aforementioned component mounting device according to this aspect, the control unit is preferably configured to acquire the height information in the vicinity of the mounting position based on a previous imaging result of the imaging portion in addition to a current imaging result of the imaging portion when the mounting position is not imaged by the imaging portion. According to this structure, even when the mounting position is not imaged by the imaging portion, the previous imaging result of the imaging portion can be used to accurately acquire the height information in the vicinity of the mounting position.

In the aforementioned component mounting device according to this aspect, the control unit is preferably configured to control the imaging portion to image a plurality of imaging positions different from the vicinity of the mounting position in addition to the vicinity of the mounting position during the movement of the mounting head, and the control unit is preferably configured to acquire the height information in the vicinity of the mounting position based on an imaging result of the vicinity of the mounting position and imaging results of the plurality of imaging positions. According to this structure, the height information in the vicinity of the mounting position can be accurately acquired using the imaging results of the plurality of imaging positions different from the vicinity of the mounting position.

In this case, the control unit is preferably configured to create a height map of the substrate based on the imaging results of the plurality of imaging positions and acquire the height information in the vicinity of the mounting position based on the imaging result of the vicinity of the mounting position and the created height map. According to this structure, the height map is used such that the height information in the vicinity of the mounting position can be more accurately acquired using the height information around the vicinity of the mounting position, for example.

In the aforementioned component mounting device according to this aspect, the imaging portion is preferably configured to be capable of imaging the substrate from a plurality of imaging directions inclined with respect to the substrate. According to this structure, the height information in the vicinity of the mounting position can be easily acquired based on the image in the vicinity of the mounting position captured from the plurality of imaging directions inclined with respect to the substrate.

According to the present disclosure, as hereinabove described, the component mounting device capable of significantly reducing or preventing an increase in the time required to produce the substrate even when correcting the target lowering position can be provided.

BRIEF DESCRIPTION OF THE DRAWINGS

FIG. 5 is a diagram for illustrating the imaging timing in the component mounting device according to the first embodiment of the present disclosure;

FIG. 6 is a diagram showing an example of downward movement of a mounting head of the component mounting device according to the first embodiment of the present disclosure;

FIG. 7 is a flowchart for illustrating component mounting processing performed by the component mounting device according to the first embodiment of the present disclosure;

DETAILED DESCRIPTION

Embodiments embodying the present disclosure are hereinafter described on the basis of the drawings.

First Embodiment (Structure of Component Mounting Device)

The structure of a component mounting device 100 according to a first embodiment of the present disclosure is now described with reference to FIGS. 1 to 6.

Figure 1:
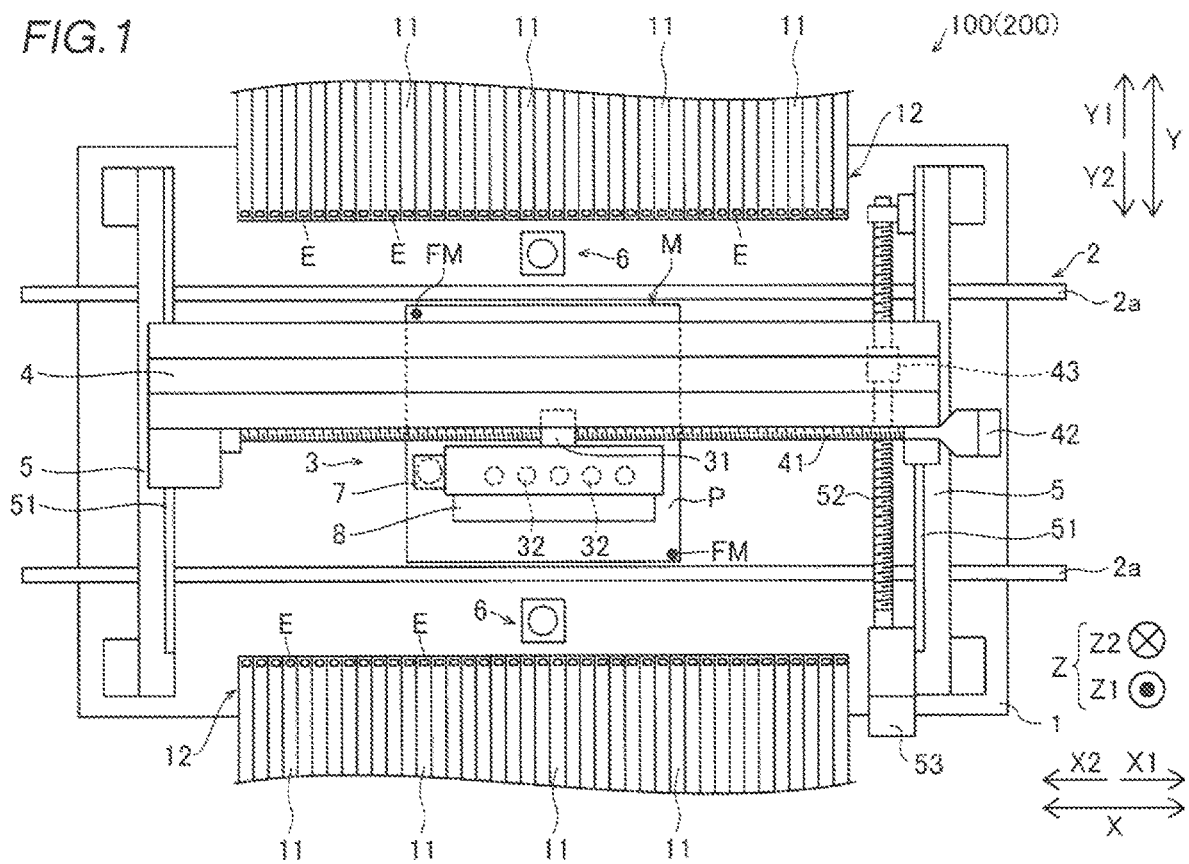
FIG. 1 is a diagram showing the overall structure of a component mounting device according to a first embodiment of the present disclosure.

As shown in FIG. 1, the component mounting device 100 is a device that mounts components E (electronic components), such as ICs, transistors, capacitors, and resistors, on a substrate P such as a printed board. The component mounting device 100 includes a base 1, a conveyance portion 2, a head unit 3, a support 4, rails 5, component recognition cameras 6, a substrate recognition camera 7, an imaging unit 8, and a controller 9 (see FIG. 2). The imaging unit 8 is an example of an "imaging portion" in the claims. The controller 9 is an example of a "control unit" in the claims.

Feeder placement portions 12 for arranging a plurality of tape feeders 11 are respectively provided on both ends (a Y1 side and a Y2 side) of the base 1 in a direction Y. The tape feeders 11 hold reels (not shown) on which tapes that hold a plurality of components E at a predetermined interval are wound. The tape feeders 11 are configured to feed the components E from the tips of the tape feeders 11 by rotating the reels to feed the tapes that hold the components E.

The respective tape feeders 11 are placed in the feeder placement portions 12 in a state where the tape feeders 11 are electrically connected to the controller 9 via connectors (not shown) provided in the feeder placement portions 12. Thus, the respective tape feeders 11 are configured to feed the tapes from the reels and feed the components E based on a control signal from the controller 9. At this time, the respective tape feeders 11 are configured to feed the components E according to the mounting operation of the head unit 3.

The conveyance portion 2 includes a pair of conveyors 2a. The conveyance portion 2 has a function of conveying the substrate P in a horizontal direction (direction X) by the pair of conveyors 2a. Specifically, the conveyance portion 2 has a function of carrying in the substrate P before mounting from an upstream (X1 side) conveyance path (not shown), conveying the carried-in substrate P to a mounting operation position M, and carrying out the substrate P, on which mounting has been completed, to a downstream (X2 side) conveyance path (not shown). The conveyance portion 2 is configured to hold and fix the substrate P stopped at the mounting operation position M by a substrate fixing mechanism (not shown) such as a clamping mechanism.

The pair of conveyors 2a of the conveyance portion 2 are configured to be capable of conveying the substrate P in the horizontal direction (direction X) while supporting the substrate P from below. Furthermore, the pair of conveyors 2a are configured such that an interval therebetween in the direction Y can be adjusted. Accordingly, it is possible to adjust the interval between the pair of conveyors 2a in the direction Y according to the size of the substrate P to be carried in.

The head unit 3 is configured to mount a component E at a mounting position Pa (see FIG. 3) on the substrate P fixed at the mounting operation position M. The head unit 3 includes a ball nut 31, five mounting heads 32, five Z-axis motors 33 (see FIG. 2) respectively provided on the five mounting heads 32, and five R-axis motors 34 (see FIG. 2) respectively provided on the five mounting heads 32.

The five mounting heads 32 are arranged in a line along the direction X on the lower surface side of the head unit 3. Nozzles 32a (see FIG. 3) are attached to the respective tips of the five mounting heads 32. The mounting heads 32 are configured to be capable of suctioning and holding the components E fed from the tape feeders 11 by a negative pressure generated at the tips of the nozzles 32a by a negative pressure generator (not shown).

Furthermore, the mounting heads 32 are configured to be capable of going up and down in an upward-downward direction (direction Z). Specifically, the mounting heads 32 are configured to be capable of going up and down between a position in a lowered state at the time of suctioning or mounting the component E and a position in a raised state at the time of conveying or imaging the component E. In the head unit 3, each of the five mounting heads 32 is configured to be capable of individually going up and down by a Z-axis motor 33 provided for each mounting head 32. Furthermore, each of the five mounting heads 32 is configured to be individually rotatable about the central axis (about the direction Z) of a nozzle 32a by an R-axis motor 34 provided for each mounting head 32.

The head unit 3 is configured to be movable in the direction X along the support 4. Specifically, the support 4 includes a ball screw shaft 41, an X-axis motor 42 that rotates the ball screw shaft 41, and a guide rail (not shown) that extends in the direction X. The ball screw shaft 41 is rotated by the X-axis motor 42 such that the head unit 3 can move in the direction X along the support 4 together with the ball nut 31 engaged with the ball screw shaft 41 (into which the ball screw shaft 41 is screwed).

The support 4 is configured to be movable in the direction Y perpendicular to the direction X along a pair of rails 5 fixed on the base 1. Specifically, the rails 5 include a pair of guide rails 51 that support both ends of the support 4 in the direction X such that the support 4 is movable in the direction Y, a ball screw shaft 52 that extends in the direction Y, and a Y-axis motor 53 that rotates the ball screw shaft 52. Furthermore, the support 4 is provided with a ball nut 43 engaged with the ball screw shaft 52 (into which the ball screw shaft 52 is screwed). The ball screw shaft 52 is rotated by the Y-axis motor 53 such that the support 4 can move in the direction Y along the pair of rails 5 together with the ball nut 43 engaged with the ball screw shaft 52 (into which the ball screw shaft 52 is screwed).

According to this structure, the head unit 3 is configured to be movable on the base 1 in the horizontal direction (the direction X and the direction Y). Thus, the head unit 3 can move above the tape feeders 11, for example, and can suction the component E fed from the tape feeders 11. Furthermore, the head unit 3 can move above the fixed substrate P at the mounting operation position M, for example, and can mount the suctioned component E on the substrate P.

The component recognition cameras 6 are configured to image the components E suctioned by the mounting heads 32 in order to recognize the suction states of the components E prior to mounting of the components E. The component recognition cameras 6 are fixed on the upper surface of the base 1 and are configured to image the components E suctioned by the mounting heads 32 from below (direction Z2) the components E. These imaging results are acquired by the controller 9. Thus, the controller 9 can recognize the suction states (the rotational orientations and the suction positions with respect to the mounting heads 32) of the components E based on the imaging results of the suctioned components E.

The substrate recognition camera 7 is configured to image position recognition marks (fiducial marks) FM provided on the substrate P prior to mounting of the components E. The position recognition marks FM are marks for recognizing the position of the substrate P. On the substrate P shown in FIG. 1, a pair of position recognition marks FM are provided at a lower right position and an upper left position on the substrate P. The imaging result of these position recognition marks FM is acquired by the controller 9. Then, the controller 9 can recognize the accurate position and orientation of the substrate P fixed by the substrate fixing mechanism (not shown) based on the imaging result of the position recognition marks FM.

Furthermore, the substrate recognition camera 7 is mounted on an X2-side portion of the head unit 3, and is configured to be movable on the base 1 in the direction X and the direction Y together with the head unit 3. The substrate recognition camera 7 is configured to move on the base 1 in the horizontal direction (the direction X and the direction Y) and image the position recognition marks FM provided on the substrate P from above (direction Z1) the substrate P.

Figure 3:
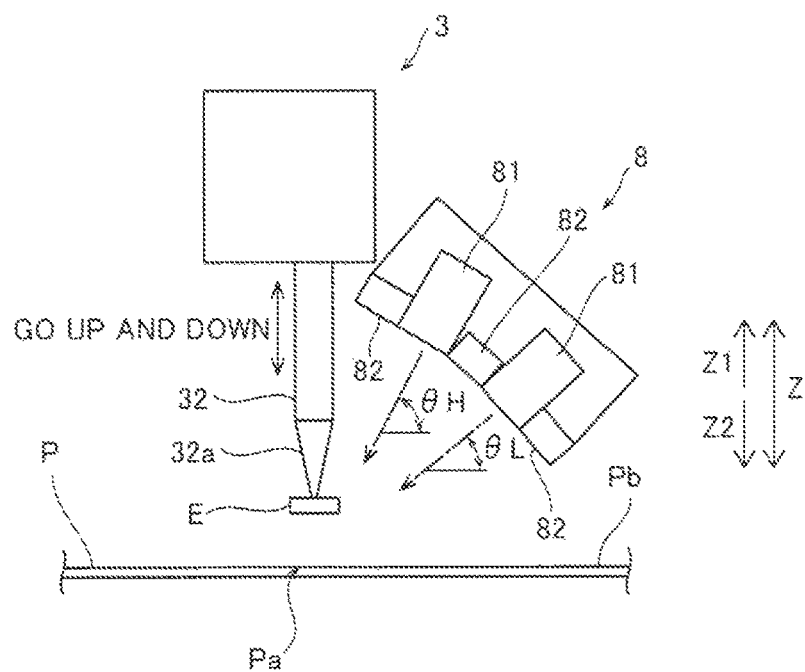
FIG. 3 is a side elevational view for illustrating an imaging unit of the component mounting device according to the first embodiment of the present disclosure.

As shown in FIGS. 1 and 3, the imaging unit 8 is configured to be capable of imaging the substrate P. Specifically, the imaging unit 8 is configured to be capable of imaging a predetermined region in the vicinity of the mounting position Pa on the substrate P in order to measure the height in the vicinity of the mounting position Pa. The imaging unit 8 includes a plurality of height measurement cameras 81 and a plurality of illumination sections 82. According to the first embodiment, the imaging unit 8 is provided with two height measurement cameras 81 and three illumination sections 82 for each mounting head 32.

As shown in FIG. 3, the two height measurement cameras 81 are configured to be capable of imaging the predetermined region in the vicinity of the mounting position Pa on the substrate P from different imaging directions from each other. Specifically, a height measurement camera 81 on the upper side (Z1 side) is configured to be capable of imaging the predetermined region in the vicinity of the mounting position Pa on the substrate P from an imaging direction inclined at an inclination angle $\theta H$ (0 degrees<$\theta H$<90 degrees) with respect to a horizontal plane (a plane substantially parallel to a substrate surface Pb on which the component E is mounted). In addition, a height measurement camera 81 on the lower side (Z2 side) is configured to be capable of imaging the predetermined region in the vicinity of the mounting position Pa on the substrate P from an imaging direction inclined at an inclination angle $\theta L$ (0 degrees<$\theta L$<$\theta H$) with respect to the horizontal plane (the plane substantially parallel to the substrate surface Pb on which the component E is mounted).

Thus, the imaging unit 8 is configured to be capable of imaging the predetermined region in the vicinity of the mounting position Pa from a plurality of imaging directions inclined with respect to the substrate surface Pb of the substrate P. The imaging results of the predetermined region in the vicinity of the mounting position Pa are acquired by the controller 9. Then, the controller 9 acquires height information in the vicinity of the mounting position Pa through stereo matching based on the two imaging results of the predetermined region in the vicinity of the mounting position Pa from the two imaging directions.

A height measurement method through stereo matching is now described with reference to FIG. 4.

Figure 4:
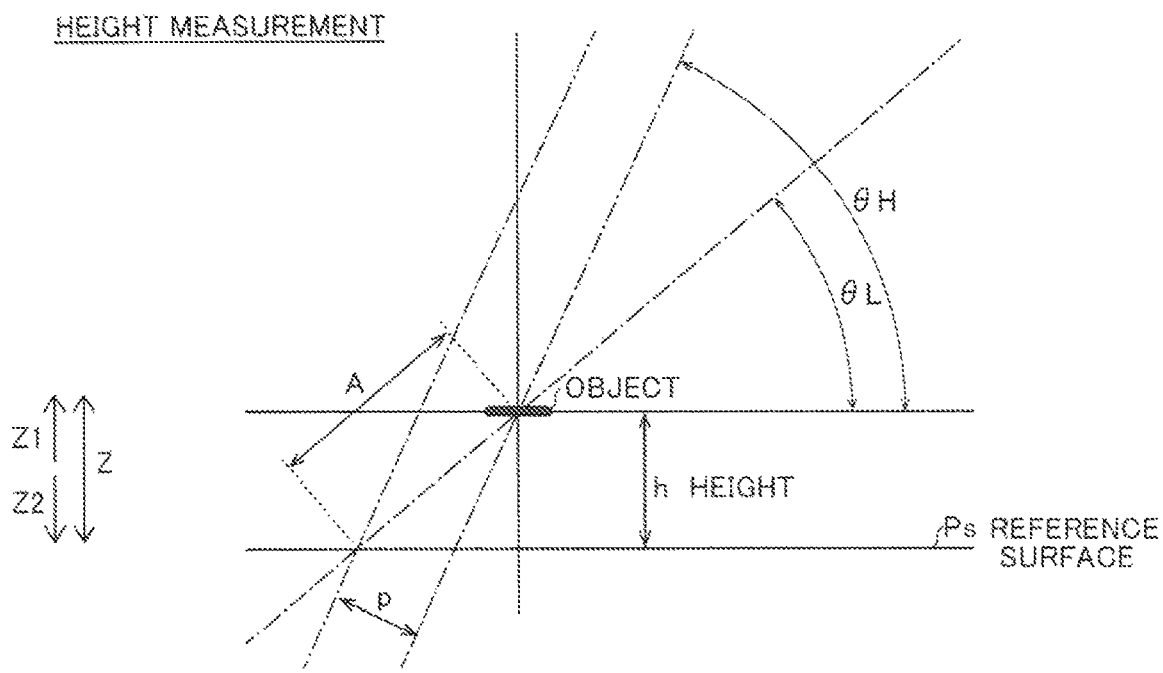
FIG. 4 is a diagram for illustrating a height calculation method through stereo matching in the component mounting device according to the first embodiment of the present disclosure.

As shown in FIG. 4, the predetermined region including an object, the height information of which is acquired, such as the substrate surface Pb or the mounting position Pa is imaged substantially simultaneously from the two imaging directions with the inclination angle $\theta H$ and the inclination angle $\theta L$ by the two height measurement cameras 81. Then, stereo matching between the image captured from the imaging direction with the inclination angle $\theta H$ and the image captured from the imaging direction with the inclination angle $\theta L$ is performed such that a parallax p (pixel) between the two captured images is obtained. Here, assuming that the camera resolution of the height measurement cameras 81 is R (μm/pixel), a distance $\underline{A}$ (μm) is obtained from the following expression (1):

$$A = p \times R / \sin(\theta H - \theta L) \quad (1).$$

In addition, the height h (μm) of the object with respect to a reference surface Ps is obtained from the following expression (2) using the distance $\underline{A}$ obtained from the expression (1):

$$h = A \times \sin(\theta L) \quad (2).$$

Thus, the height information in the vicinity of the mounting position Pa, for example, with respect to the reference surface Ps is acquired by the controller 9. The reference surface Ps is a surface having a reference height in the case where there is no positional deviation of the substrate P in a height direction.

As the height information, any information may be used so far as the same is information that correlates with the height h. For example, information of the height h shown in FIG. 4 may be used as the height information, or information of the distance $\underline{A}$ that correlates with the height h or information such as information of the parallax p may be used as the height information. In addition, a method for acquiring the height information through stereo matching is not restricted to the above example, but any method may be used.

The illumination sections 82 are provided in the vicinity of the height measurement cameras 81 and are configured to emit light when the height measurement cameras 81 capture images. In addition, the illumination sections 82 each include a light source such as an LED (light-emitting diode).

As shown in FIG. 1, the imaging unit 8 is mounted on a Y2-side portion of the head unit 3. Thus, the imaging unit 8 is configured to be movable on the base 1 in the horizontal direction (the direction X and the direction Y) together with the head unit 3 (mounting heads 32). On the other hand, the imaging unit 8 does not move with upward and downward movement of the mounting heads 32.

Figure 2:
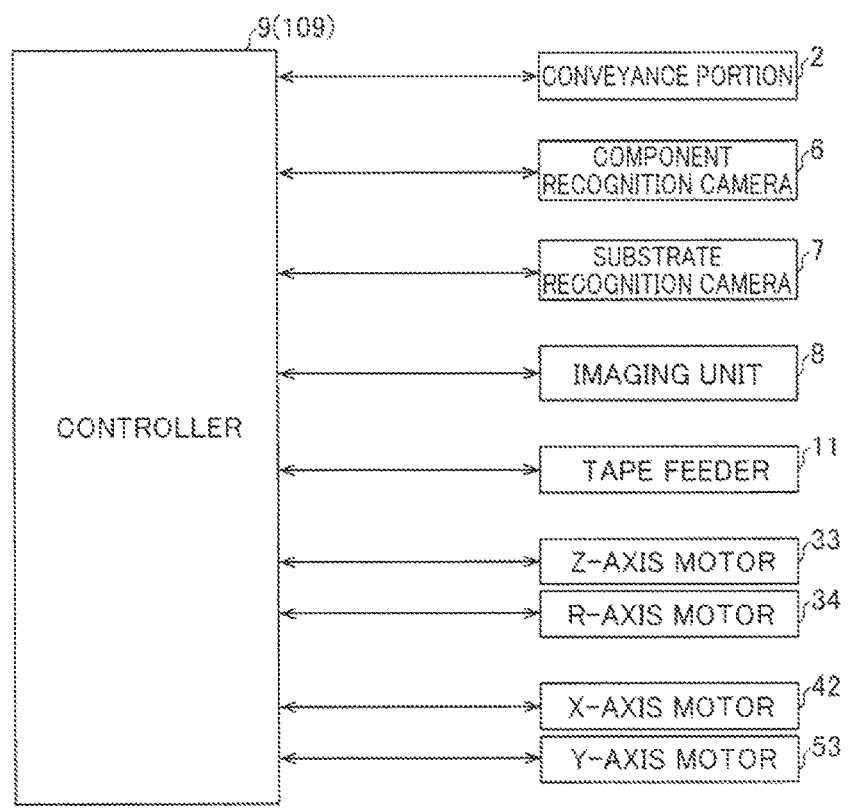
FIG. 2 is a block diagram showing the control structure of the component mounting device according to the first embodiment of the present disclosure.

As shown in FIG. 2, the controller 9 includes a CPU (central processing unit), a ROM (read only memory), a RAM (random access memory), etc., and is configured to control the operation of the component mounting device 100. Specifically, the controller 9 controls the conveyance portion 2, the X-axis motor 42, the Y-axis motor 53, the Z-axis motor 33, the R-axis motor 34, etc. according to programs stored in advance to mount the components E on the substrate P.

More specifically, the controller 9 moves the head unit 3 above the tape feeders 11, generates a negative pressure at the nozzles 32a of the mounting heads 32 by the negative pressure generator (not shown), and controls the nozzles 32a to suction the components E fed from the tape feeders 11. Then, the controller 9 moves the head unit 3 from above the tape feeders 11 to above the substrate P in order to mount the suctioned components E on the substrate P. During this movement, the controller 9 moves the head unit 3 such that the head unit 3 passes above the component recognition cameras 6, and controls the component recognition cameras 6 to image the components E suctioned by the respective mounting heads 32.

As shown in FIG. 5, the controller 9 is configured to start downward movement of the mounting head 32 before the mounting head 32 arrives directly above the mounting position Pa. Thus, the downward movement (movement in the height direction) of the mounting head 32 can be performed concurrently with the movement in the horizontal direction (directions X and Y), and hence the time required to mount the components can be reduced.

The controller 9 is configured to mount the suctioned components E on the substrate P by stopping supply of a negative pressure to the mounting heads 32 at the predetermined timing. At this time, the controller 9 is configured to mount the components E on the substrate P with target lowering positions of the mounting heads 32 corrected.

(Structure of Controller Involving Correction of Target Lowering Position)

According to the first embodiment, the controller 9 is configured to determine the imaging timing of the imaging unit 8 based on the predicted arrival timing at which the component E is predicted to reach the substrate P, as shown in FIGS. 5 and 6, control the imaging unit 8 to image the predetermined region in the vicinity of the mounting position Pa at the determined imaging timing during the movement of the mounting head 32 to the mounting position Pa, acquire the height information of the substrate surface Pb of the substrate P in the vicinity of the mounting position Pa based on the imaging result of the imaging unit 8, and correct a target lowering position of the mounting head 32 based on the acquired height information of the substrate surface Pb of the substrate P in the vicinity of the mounting position Pa.

That is, according to the first embodiment, the controller 9 is configured to perform three operations, i.e. controlling the imaging unit 8 to image the predetermined region in the vicinity of the mounting position Pa, acquiring the height information of the substrate surface Pb of the substrate P in the vicinity of the mounting position Pa based on the imaging result of the imaging unit 8, and correcting the target lowering position of the mounting head 32 based on the acquired height information of the substrate surface Pb of the substrate P in the vicinity of the mounting position Pa, during the movement of the mounting head 32.

At this time, the controller 9 is configured to correct the target lowering position of the mounting head 32 in the height direction (direction Z). Thus, the component E can be mounted on the substrate P with an appropriate depression amount.

Specifically, the controller 9 is configured to correct the target lowering position of the mounting head 32 in the height direction to an upper position when determining that the substrate P is positionally deviated upward (direction Z1) with respect to the reference surface Ps based on the acquired height information of the substrate surface Pb of the substrate P in the vicinity of the mounting position Pa.

Furthermore, the controller is configured to correct the target lowering position of the mounting head 32 in the height direction to a lower position when determining that the substrate P is positionally deviated downward (direction Z2) with respect to the reference surface Ps based on the acquired height information of the substrate surface Pb of the substrate P in the vicinity of the mounting position Pa.

The controller 9 is configured to acquire two required times, i.e. a first required time required from imaging of the vicinity of the mounting position Pa to correction of the target lowering position and a second required time required from the correction of the target lowering position to arrival of the component E at the substrate P, in order to determine the imaging timing of the imaging unit 8. The first required time may include the time required for exposure and imaging of the height measurement cameras 81 of the imaging unit 8, the image transfer time from the height measurement cameras 81 of the imaging unit 8, the time required for height measurement processing for acquiring (calculating) the height information, and the time required for processing for correcting the target lowering position, for example.

According to the first embodiment, the controller 9 is configured to acquire, as the first required time, the time obtained by adding the time required for exposure and imaging of the height measurement cameras 81 of the imaging unit 8, the image transfer time from the height measurement cameras 81 of the imaging unit 8, the time required for height measurement processing for calculating the height information, and the time required for processing for correcting the target lowering position. Furthermore, the controller 9 is configured to acquire (calculate) the first required time for each component E mounting operation of the mounting head 32.

That is, when T1 represents the first required time, T1$a$ represents the time required for exposure and imaging of the height measurement cameras 81 of the imaging unit 8, T1$b$ represents the image transfer time from the height measurement cameras 81 of the imaging unit 8, T1$c$ represents the time required for height measurement processing for calculating the height information, and T1$d$ represents the time required for processing for correcting the target lowering position, the first required time T1 can be represented by the following expression (3):

$$T1 = T1a + T1b + T1c + T1d \tag{3}$$

The second required time may include a time period from start of deceleration of the mounting head 32 to stop of the mounting head 32 during the downward movement of the mounting head 32, for example.

According to the first embodiment, the controller 9 is configured to acquire a fixed value set in advance as the second required time regardless of which component E is mounted. Incidentally, the fixed value includes the time period from start of deceleration of the mounting head 32 to stop of the mounting head 32 during the downward movement of the mounting head 32.

An example of a method for determining the second required time is now described with reference to FIG. 6. FIG. 6 shows a graph in which the vertical axis represents the speed (m/s) of the mounting head 32, and the horizontal axis represents time (ms).

As shown in FIG. 6, assume that the component E suctioned by the mounting head 32 reaches the substrate P at a height position Ph (see FIG. 5) described below, which is higher by Δh than the reference height, after 8 ms when the downward movement start timing is set to 0 ms. Furthermore, assume that it takes 1.5 ms from start of deceleration of the mounting head 32 to stop of the mounting head 32 during the downward movement of the mounting head 32.

In this case, it is necessary to correct the target lowering position of the mounting head 32 by the time (deceleration start timing) of 6.5 ms traced back by 1.5 ms from the time of 8 ms. That is, the time of 6.5 ms is the correction limit timing. Therefore, a value including errors due to device variations, the fixed state of the substrate P, etc. is set as a fixed value in the time of 1.5 ms when the fixed value is set based on the mounting operation as shown in FIG. 6.

That is, when T2 represents the second required time, T2$a$ represents the time period from start of deceleration of the mounting head 32 to stop of the mounting head 32 during the downward movement of the mounting head 32, and T2$b$ represents the errors due to device variations, the fixed state of the substrate P, etc., the second required time T2 can be represented by the following expression (4):

$$T2 = T2a + T2b \tag{4}$$

According to the first embodiment, the controller 9 is configured to determine the imaging timing of the imaging unit 8 in consideration of the two acquired required times, i.e. the first required time and the second required time. Specifically, the controller 9 is configured to first determine the predicted arrival timing at which the component E is predicted to reach the substrate P. The predicted arrival timing may be determined based on a distance (a distance in the horizontal direction and a distance in the height direction) between the component E suctioned by the mounting head 32 and the substrate P or the movement speed (the movement speed in the horizontal direction and the movement speed in the height direction) of the mounting head 32, for example.

In this case, the controller 9 is configured to predict that the component E suctioned by the mounting head 32 reaches the substrate P at the height position Ph higher by Δh than the reference height (the height position of the reference surface Ps) in the case where there is no positional deviation of the substrate P in the height direction and determine the predicted arrival timing. The height position Ph higher by Δh than the reference height is a height position in the case where the substrate P is maximally positionally deviated in the height direction within an allowable range when the component E is mounted on the substrate surface Pb of the substrate P. Furthermore, the height position higher by Δh than the reference height is a height position obtained by adding the thickness of the lower component E to the height position in the case where the substrate P is maximally positionally deviated in the height direction within an allowable range when the component E is mounted on the previously mounted component E.

The controller 9 is configured to determine, as the imaging timing, the timing traced back from the determined predicted arrival timing by the two times, i.e. the first required time and the second required time. That is, when T1 and T2 represent the first required time and the second required time, respectively, as described above, T3 represents the predicted arrival timing, and T represents the time traced back from the predicted arrival timing, the traced back time can be represented by the following expression (5):

$$T = T3 - T1 - T2 \quad (5).$$

In this case, the timing traced back by only the second required time from the determined predicted arrival timing is the correction timing at which the target lowering position is corrected.

In the case shown in FIG. 6, for example, the imaging timing is set such that imaging is performed during horizontal movement of the mounting head 32 before the downward movement of the mounting head 32, and the correction timing is set such that correction is performed during the downward movement and horizontal movement of the mounting head 32. Note that the imaging timing and the correction timing are not restricted to the example shown in FIG. 6. For example, the imaging timing and the correction timing may be set such that imaging and correction are performed during the horizontal movement of the mounting head 32 before the downward movement of the mounting head 32, or the imaging timing and the correction timing may be set such that imaging and correction are performed during the downward movement and horizontal movement of the mounting head 32.

Depending on the acquired first required time and second acquired time, the timing at which the mounting position Pa is not included within the fields of view of the height measurement cameras 81 of the imaging unit 8 may be set as the imaging timing. Therefore, according to the first embodiment, the controller 9 is configured to acquire the height information in the vicinity of the mounting position Pa based on the previous imaging result of the imaging unit 8 in addition to the current imaging result of the imaging unit 8 when the mounting position Pa is not imaged by the imaging unit 8 (when an image including the mounting position Pa is not acquired).

Specifically, the controller 9 is configured to correct the height information in the vicinity of the mounting position Pa based on the current imaging result of the imaging unit 8, based on the height information around the mounting position Pa, at which the current component E is mounted, acquired based on the imaging result previously captured by the imaging unit 8, and acquire the height information in the vicinity of the mounting position Pa. The controller 9 is configured to acquire the height information in the vicinity of the mounting position Pa based on the current imaging result of the imaging unit 8 when the mounting position Pa is imaged by the imaging unit 8 (when an image including the mounting position Pa is acquired).

(Component Mounting Processing)

Component mounting processing including the processing for correcting the target lowering position described above is now described based on a flowchart with reference to FIG. 7. The component mounting processing is performed by the controller 9. For ease of understanding, "a" is put on steps of processing for moving the mounting head 32 in the horizontal direction (directions X and Y), "b" is put on steps of processing for moving the mounting head 32 in the height direction (direction Z), and "c" is put on steps of height measurement processing and target position correction processing.

As shown in FIG. 7, first, in step S1a, position XY movement of the mounting head 32 from the suction position of the component E on the tape feeders 11 or the mounting position of the previous component E, for example, to the mounting position of the current component E is started. Then, in step S2a, the mounting head 32 is continuously moved.

In step S1c, the imaging unit 8 is on standby in a standby state. In step S2c, it is determined whether or not it is the imaging timing of the imaging unit 8 during the position XY movement of the mounting head 32.

That is, in step S2c, it is determined whether or not the current time is the imaging timing traced back from the predicted arrival timing by the two times, i.e. the first required time and the second required time (see FIG. 5). When determining in step S2c that it is not the imaging timing of the imaging unit 8, the controller 9 returns to step S1c. Then, the controller 9 repeats the processing in step S1c and step S2c until it is the imaging timing. When determining in step S2c that it is the imaging timing of the imaging unit 8, the controller 9 advances to step S3c.

Then, in step S3c, the predetermined region in the vicinity of the mounting position Pa is imaged (imaging for height measurement is performed) by the imaging unit 8 during the movement of the mounting head 32.

Then, in step S4c, the height information in the vicinity of the mounting position Pa is acquired based on the imaging result of the imaging unit 8. At this time, the height information in the vicinity of the mounting position Pa is acquired based on the current imaging result of the imaging unit 8 when the mounting position Pa is imaged by the imaging unit 8. When the mounting position Pa is not imaged by the imaging unit 8, the height information in the vicinity of the mounting position Pa is acquired based on the previous imaging result of the imaging unit 8 in addition to the current imaging result of the imaging unit 8.

Then, in step S5c, the target lowering position is corrected based on the acquired height information in the vicinity of the mounting position Pa. FIG. 7 shows the case where the target lowering position is corrected during the downward movement of the mounting head 32.

In step S1b, the downward movement of the mounting head 32 is started.

Then, in step S2b and step S3a, the component E suctioned by the mounting head 32 reaches a target position XYZ (corrected target lowering position). Thereafter, supply of a negative pressure is stopped such that the component E suctioned by the mounting head 32 is mounted on the substrate P. Then, the component E mounting processing is terminated.

(Effects of First Embodiment)

According to the first embodiment, the following effects can be obtained. According to the first embodiment, as hereinabove described, the component mounting device 100 includes the controller 9 that determines the imaging timing of the imaging unit 8 based on the predicted arrival timing at which the component E is predicted to reach the substrate P, at least controls the imaging unit 8 to image the vicinity of the mounting position Pa at the determined imaging timing during the movement of the mounting head 32, acquires the height information in the vicinity of the mounting position Pa based on the imaging result of the imaging unit 8, and corrects the target lowering position of the mounting head 32 based on the acquired height information in the vicinity of the mounting position Pa. Thus, it is not necessary to stop the mounting head 32 for imaging to correct the target lowering position, and hence it is possible to prevent at least latency for the imaging operation from occurring in the operation of the mounting head 32. Consequently, even when the target lowering position is corrected, it is possible to significantly reduce or prevent an increase in the time required to produce the substrate P. Furthermore, the controller 9 is configured to determine the imaging timing of the imaging unit 8 based on the predicted arrival timing at which the component E is predicted to reach the substrate P such that the imaging unit 8 can easily perform imaging during the movement of the mounting head 32 unlike the case where the imaging timing of the imaging unit 8 is determined on a positional basis.

According to the first embodiment, as hereinabove described, the controller 9 is configured to control the imaging unit 8 to image the vicinity of the mounting position Pa, acquire the height information in the vicinity of the mounting position Pa based on the imaging result of the imaging unit 8, and correct the target lowering position of the mounting head 32 based on the height information in the vicinity of the mounting position Pa, during the movement of the mounting head 32. Thus, the operation from the imaging operation to the correction processing can be performed during the movement of the mounting head 32, and hence it is possible to effectively significantly reduce or prevent occurrence of latency in the operation of the mounting head 32. Consequently, it is possible to effectively significantly reduce or prevent an increase in the time required to produce the substrate.

According to the first embodiment, as hereinabove described, the controller 9 is configured to determine the imaging timing of the imaging unit 8 in consideration of the first required time required from imaging of the vicinity of the mounting position Pa to correction of the target lowering position and the second required time required from the correction of the target lowering position to arrival of the component E at the substrate P. When imaging for correcting the target lowering position is performed during the movement of the mounting head 32, no time for imaging is independently provided unlike the case where imaging is performed after the mounting head 32 is stopped, and hence there is a high need to properly set the imaging timing of the imaging unit 8. Therefore, as described above, the controller 9 is configured to determine the imaging timing of the imaging unit 8 in consideration of the first required time and the second required time such that it is possible to determine the imaging timing in consideration of both the first required time required from imaging of the vicinity of the mounting position Pa to correction of the target lowering position and the second required time required from the correction of the target lowering position to arrival of the component E at the substrate P, and hence it is possible to properly set (determine) the imaging timing of the imaging unit 8.

According to the first embodiment, as hereinabove described, the controller 9 is configured to determine, as the imaging timing, the timing traced back from the predicted arrival timing at which the component E is predicted to reach the substrate P by the sum of the first required time and the second required time. Thus, a time point at which the first required time required from imaging of the vicinity of the mounting position Pa to correction of the target lowering position and the second required time required from the correction of the target lowering position to arrival of the component E at the substrate P are ensured can be determined as the imaging timing. Consequently, the imaging unit 8 can perform imaging in a state where the first required time and the second required time are ensured. Therefore, even when imaging for correcting the target lowering position is performed during the movement of the mounting head 32, correction of the target lowering position can be reliably made in time before the component E is mounted on the substrate P, and hence it is possible to reliably mount the component E with the target lowering position corrected.

Furthermore, as compared with the case where the timing traced back by more than the sum of the first required time and the second required time is determined as the imaging timing, the imaging unit 8 can perform imaging at a position closer to the mounting position Pa. Consequently, the height information of high accuracy can be acquired based on the imaging result at the position closer to the mounting position Pa.

According to the first embodiment, as hereinabove described, the controller 9 is configured to predict that the component E reaches the substrate P at the height position higher than the reference height in the case where there is no positional deviation of the substrate P in the height direction and determine the predicted arrival timing. Thus, even when the substrate P is warped upward such that the mounting position Pa is higher than the reference height, for example, correction of the target lowering position can be more reliably made in time before the component E is mounted on the substrate P.

According to the first embodiment, as hereinabove described, the controller 9 is configured to acquire a fixed value as the second required time. Thus, it is not necessary to acquire the second required time for each component E mounting operation, and hence it is possible to significantly reduce or prevent an increase in the processing load on the controller 9.

According to the first embodiment, as hereinabove described, the controller 9 is configured to acquire the height information in the vicinity of the mounting position Pa based on the previous imaging result of the imaging unit 8 in addition to the current imaging result of the imaging unit 8 when the mounting position Pa is not imaged by the imaging unit 8. Thus, even when the mounting position Pa is not imaged by the imaging unit 8, the previous imaging result of the imaging unit 8 can be used to accurately acquire the height information in the vicinity of the mounting position Pa.

According to the first embodiment, as hereinabove described, the imaging unit 8 is configured to be capable of imaging the substrate P from the plurality of imaging directions inclined with respect to the substrate P. Thus, the height information in the vicinity of the mounting position Pa can be easily acquired based on the image in the vicinity of the mounting position Pa captured from the plurality of imaging directions inclined with respect to the substrate P.

Second Embodiment

A second embodiment is now described with reference to FIGS. 1 to 3 and 8. In this second embodiment, in addition to the structure of the first embodiment described above, an example in which a plurality of imaging positions different from the vicinity of a mounting position are imaged by an imaging unit is described.

(Structure of Component Mounting Device)

As shown in FIG. 2, a component mounting device 200 (see FIG. 1) according to the second embodiment of the present disclosure is different from the component mounting device 100 according to the first embodiment described above in that the component mounting device 200 includes a controller 109. The controller 109 is an example of a "control unit" in the claims. The same structures as those of the first embodiment described above are denoted by the same reference numerals, and description thereof is omitted.

(Structure of Controller Involving Correction of Target Lowering Position)

Figure 8:
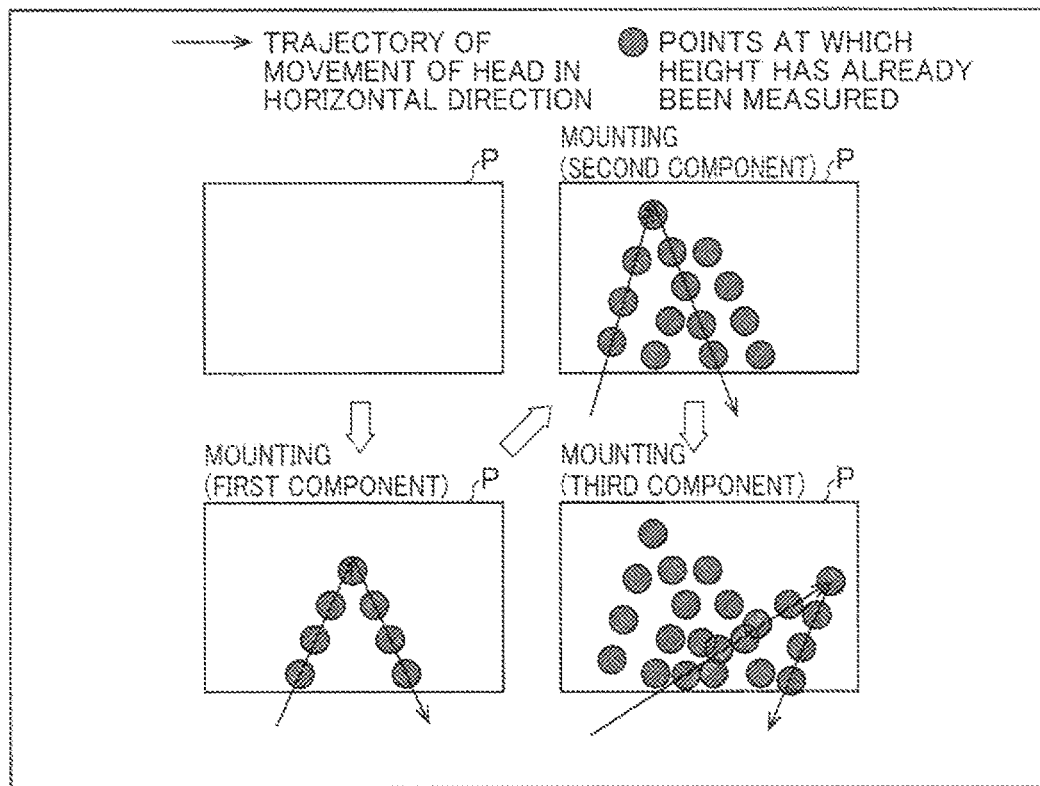
FIG. 8 is a diagram for illustrating height measurement of a component mounting device according to a second embodiment of the present disclosure.

According to the second embodiment, the controller 109 is configured to control an imaging unit 8 to image a plurality of imaging positions (points, at which the height has already been measured, shown in FIG. 8) different from the vicinity of a mounting position Pa on a substrate P in addition to the vicinity of the mounting position Pa (see FIG. 3) during movement of a mounting head 32, as shown in FIG. 8.

Specifically, the controller 109 is configured to image the plurality of imaging positions different from the vicinity of the mounting position Pa by controlling the imaging unit 8 to repetitively perform imaging during the movement of the mounting head 32 before mounting of a component E and during the movement of the mounting head 32 after mounting of the component E. At this time, the controller 109 controls the imaging unit 8 to repetitively perform imaging at a predetermined time interval or distance interval, for example.

Furthermore, according to the second embodiment, the controller 109 is configured to acquire height information in the vicinity of the mounting position Pa based on the imaging result of the vicinity of the mounting position Pa and the imaging results of the plurality of imaging positions.

Specifically, the controller 109 is configured to create a height map of the substrate P based on the imaging results of the plurality of imaging positions. The height map of the substrate P is a map in which XY-coordinate positions on the substrate P and height information at the XY-coordinate positions are associated with each other.

The controller 109 is configured to correct the height information in the vicinity of the mounting position Pa based on the current imaging result of the imaging unit 8, based on the height information around the mounting position Pa in the height map and acquire the height information in the vicinity of the mounting position Pa. Thus, the controller 109 is configured to acquire the height information in the vicinity of the mounting position Pa based on the imaging result of the vicinity of the mounting position Pa and the height map of the substrate P. The controller 109 is also configured to acquire the height information in the vicinity of the mounting position Pa based on the imaging result of the vicinity of the mounting position Pa and the height map of the substrate P when the mounting position Pa is not imaged by the imaging unit 8 and when the mounting position Pa is imaged by the imaging unit 8.

The operation of creating the height map is now described with reference to FIG. 8. Here, an example in which components E are mounted one by one on the substrate P is described.

As shown in FIG. 8, a first component E is mounted on the substrate P by the mounting head 32. At this time, imaging is repetitively performed by the imaging unit 8 during horizontal movement of the mounting head 32 before mounting of the component E and during horizontal movement of the mounting head 32 after mounting of the component E. Consequently, a plurality of imaging positions are imaged by the imaging unit 8. Furthermore, the height information of each of the imaging positions is acquired based on the imaging result of each of the imaging positions.

Also when the components E subsequent to the first component E, such as second and third components, are mounted, the same operation as when the first component E is mounted is performed. That is, imaging is repetitively performed by the imaging unit 8 during the horizontal movement of the mounting head 32 before mounting of the component E and during the horizontal movement of the mounting head 32 after mounting of the component E. Similarly to when the first component E is mounted, a plurality of imaging positions are imaged by the imaging unit 8, and the height information of each of the imaging positions is acquired based on the imaging result of each of the imaging positions.

Then, the height map of the substrate P is created at any time based on the height information of each of the imaging positions acquired for each component E mounting operation. That is, the height information is added to the height map of the substrate P and is updated at any time for each component E mounting operation.

The height information in the vicinity of the mounting position Pa based on the current imaging result of the imaging unit 8 is corrected based on the height information around the mounting position Pa in the created height map, and the height information in the vicinity of the mounting position Pa is acquired. Thereafter, a target lowering position of the mounting head 32 is corrected based on the height information in the vicinity of the mounting position Pa.

The remaining structures of the second embodiment are similar to those of the aforementioned first embodiment.

(Effects of Second Embodiment)

According to the second embodiment, the following effects can be obtained. According to the second embodiment, as hereinabove described, the controller 109 is configured to control the imaging portion to image the plurality of imaging positions different from the vicinity of the mounting position Pa in addition to the vicinity of the mounting position Pa during the movement of the mounting head 32. Furthermore, the controller 109 is configured to acquire the height information in the vicinity of the mounting position Pa based on the imaging result of the vicinity of the mounting position Pa and the imaging results of the plurality of imaging positions. Thus, the height information in the vicinity of the mounting position Pa can be accurately acquired using the imaging results of the plurality of imaging positions different from the vicinity of the mounting position Pa.

According to the second embodiment, as hereinabove described, the controller 109 is configured to create the height map of the substrate P based on the imaging results of the plurality of imaging positions and acquire the height information in the vicinity of the mounting position Pa based on the imaging result of the vicinity of the mounting position Pa and the created height map. Thus, the height map is used such that the height information in the vicinity of the mounting position Pa can be more accurately acquired using the height information around the vicinity of the mounting position Pa.

The remaining effects of the second embodiment are similar to those of the aforementioned first embodiment.

[Modifications]

The embodiments disclosed this time must be considered as illustrative in all points and not restrictive. The range of the present disclosure is shown not by the above description of the embodiments but by the scope of claims for patent, and all modifications within the meaning and range equivalent to the scope of claims for patent are further included.

While the example in which the three operations, i.e. controlling the imaging unit to image the predetermined region in the vicinity of the mounting position, acquiring the height information of the substrate surface of the substrate in the vicinity of the mounting position based on the imaging result of the imaging unit, and correcting the target lowering position of the mounting head based on the acquired height information of the substrate surface of the substrate in the vicinity of the mounting position are performed during the movement of the mounting head has been shown in each of the aforementioned first and second embodiments, the present disclosure is not restricted to this. According to the present disclosure, during the movement of the mounting head, only imaging of the predetermined region in the vicinity of the mounting position by the imaging unit may be performed, or imaging of the predetermined region in the vicinity of the mounting position by the imaging unit and acquisition of the height information of the substrate surface of the substrate in the vicinity of the mounting position based on the imaging result of the imaging unit may be performed.

While the example in which a fixed value set in advance is acquired as the second required time regardless of which component E is mounted has been shown in each of the aforementioned first and second embodiments, the present disclosure is not restricted to this. According to the present disclosure, the second required time may be acquired (calculated) for each component mounting operation of the mounting head. Alternatively, the second required time may be acquired for each component mounting operation of the mounting head based on a required time table set in advance.

While the example in which the first required time is acquired (calculated) for each component mounting operation of the mounting head has been shown in each of the aforementioned first and second embodiments, the present disclosure is not restricted to this. According to the present disclosure, regardless of which component E is mounted, a fixed value set in advance may be acquired as the first required time. Alternatively, the first required time may be acquired for each component mounting operation of the mounting head based on a required time table set in advance.

While the example in which the timing traced back from the predicted arrival timing by the two times, i.e. the first required time and the second required time, is determined as the imaging timing has been shown in each of the aforementioned first and second embodiments, the present disclosure is not restricted to this. According to the present disclosure, the timing traced back from the predicted arrival timing by more than the sum of the first required time and the second required time may be determined as the imaging timing.

While the example in which the component suctioned by the mounting head is predicted to reach the substrate at the height position higher than the reference height in the case where there is no positional deviation of the substrate in the height direction and the predicted arrival timing is determined has been shown in each of the aforementioned first and second embodiments, the present disclosure is not restricted to this. According to the present disclosure, the component suctioned by the mounting head may be predicted to reach the substrate at the reference height in the case where there is no positional deviation of the substrate in the height direction, and the predicted arrival timing may be determined.

While the example in which when the mounting position is not imaged by the imaging unit, the height information in the vicinity of the mounting position is acquired based on the previous imaging result of the imaging unit in addition to the current imaging result of the imaging unit has been shown in each of the aforementioned first and second embodiments, the present disclosure is not restricted to this. According to the present disclosure, when the mounting position is not imaged by the imaging unit, the height information in the vicinity of the mounting position may be acquired based only on the current imaging result of the imaging unit.

While the example in which the mounting head starts to lower before the mounting head arrives directly above the mounting position has been shown in each of the aforementioned first and second embodiments, the present disclosure is not restricted to this. According to the present disclosure, the mounting head may start to lower after the mounting head arrives directly above the mounting position. Also in this case, the same effects as those of the aforementioned first embodiment can be obtained by at least controlling the imaging unit to image the predetermined region in the vicinity of the mounting position during the movement of the mounting head.

Figure 9:
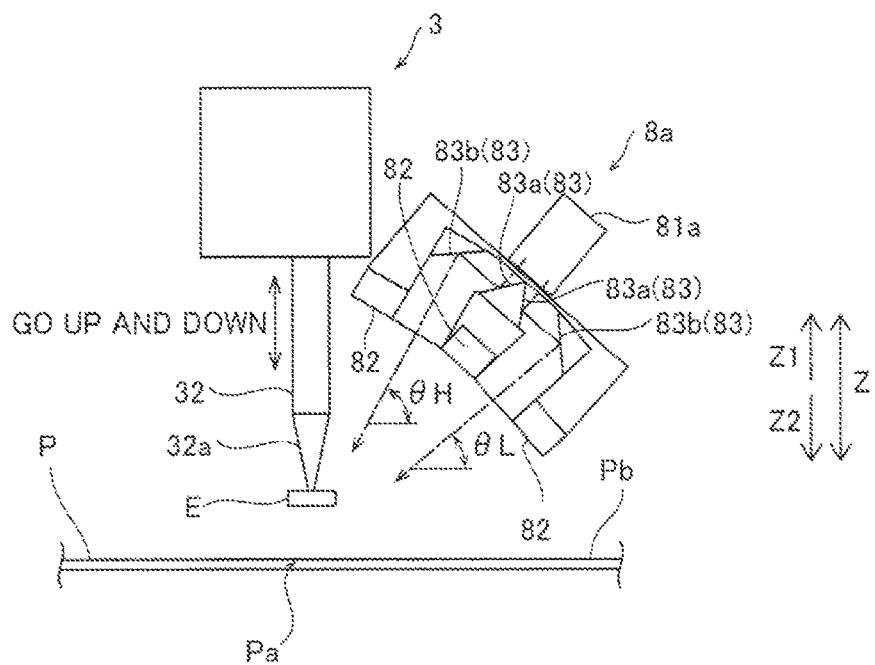
FIG. 9 is a side elevational view for illustrating an imaging unit of a component mounting device according to a modification of the first and second embodiments of the present disclosure.

While the example in which the imaging unit is configured to be capable of imaging the mounting position from the plurality of (two) imaging directions with the plurality of (two) height measurement cameras has been shown in each of the aforementioned first and second embodiments, the present disclosure is not restricted to this. According to the present disclosure, the imaging unit may be configured to be capable of imaging the mounting position from the plurality of imaging directions with a single height measurement camera. For example, in a modification shown in FIG. 9, an imaging unit 8a includes a single height measurement camera 81a, illuminators 82, and optical systems 83 including mirrors 83a and mirrors 83b. In addition, the imaging unit 8a is configured to be capable of imaging a mounting position from a plurality of imaging directions by dividing the field of view of the single height measurement camera 81a with the optical systems 83. The imaging unit 8a is an example of an "imaging portion" in the claims.

While the example in which the imaging unit is configured to be capable of imaging the mounting position from the two imaging directions has been shown in each of the aforementioned first and second embodiments, the present disclosure is not restricted to this. According to the present disclosure, the imaging unit may be configured to be capable of imaging the mounting position from three or more imaging directions. In this case, the height information may be acquired through stereo matching based on imaging results from the three or more imaging directions.

While the processing performed by the controller is described, using the flow described in a manner driven by a flow in which processing is performed in order along a processing flow for the convenience of illustration in the aforementioned first embodiment, the present disclosure is not restricted to this. According to the present disclosure, the processing performed by the controller may be performed in an event-driven manner in which processing is performed on an event basis. In this case, the processing may be performed in a complete event-driven manner or in a combination of an event-driven manner and a manner driven by a flow.

What is claimed is:

1. A component mounting device comprising:
   a mounting head configured to move with respect to a substrate and mount a component at a mounting position on the substrate;
   an imager configured to move together with the mounting head and image the substrate; and
   a controller configured to determine an imaging timing of the imager based on a predicted arrival timing at which the component is predicted to reach the substrate, control the imager to image a vicinity of the mounting position at the determined imaging timing during movement of the mounting head, acquire height information in the vicinity of the mounting position based on an imaging result of the imager, and correct a target lowering position of the mounting head based on the acquired height information in the vicinity of the mounting position.

2. The component mounting device according to claim 1, wherein:
   the controller is configured to acquire the height information in the vicinity of the mounting position based on the imaging result of the imager during the movement of the mounting head and correct the target lowering position of the mounting head based on the height information in the vicinity of the mounting position during the movement of the mounting head.

3. The component mounting device according to claim 2, wherein:
   the controller is configured to determine the imaging timing in consideration of a first required time required from imaging of the vicinity of the mounting position to correction of the target lowering position and a second required time required from the correction of the target lowering position to the predicted arrival timing.

4. The component mounting device according to claim 3, wherein:
   the controller is configured to determine, as the imaging timing, a timing traced back from the predicted arrival timing by at least a sum of the first required time and the second required time.

5. The component mounting device according to claim 4, wherein:
   the controller is configured to predict that the component reaches the substrate at a height position higher than a reference height in a case where there is no positional deviation of the substrate in a height direction and determine the predicted arrival timing.

6. The component mounting device according to claim 3, wherein:
   the controller is configured to acquire a fixed value as the second required time.

7. The component mounting device according to claim 1, wherein:
   the controller is configured to acquire the height information in the vicinity of the mounting position based on a previous imaging result of the imager in addition to a current imaging result of the imager.

8. The component mounting device according to claim 1, wherein:
   the controller is configured to control the imager to image a plurality of imaging positions different from the vicinity of the mounting position in addition to the vicinity of the mounting position during the movement of the mounting head, and
   the controller is configured to acquire the height information in the vicinity of the mounting position based on an imaging result of the vicinity of the mounting position and imaging results of the plurality of imaging positions.

9. The component mounting device according to claim 8, wherein:
   the controller is configured to create a height map of the substrate based on the imaging results of the plurality of imaging positions and acquire the height information in the vicinity of the mounting position based on the imaging result of the vicinity of the mounting position and the created height map.

10. The component mounting device according to claim 1, wherein:
    the imager is configured to image the substrate from a plurality of imaging directions inclined with respect to the substrate.

* * * * *